United States Patent
Park et al.

(10) Patent No.: US 10,505,056 B2
(45) Date of Patent: Dec. 10, 2019

(54) COMPOSITION FOR FORMING ELECTRODE, ELECTRODE MANUFACTURED USING THE SAME AND SOLAR CELL

(71) Applicant: SAMSUNG SDI CO., LTD., Yongin-si, Gyeonggi-do (KR)

(72) Inventors: Sanghee Park, Suwon-si (KR); Hyunjin Koo, Suwon-si (KR); Daechan Kwon, Suwon-si (KR); Tae-Joon Kim, Suwon-si (KR); Min-Su Park, Suwon-si (KR); Jiseon Lee, Suwon-si (KR); Myung-Sung Jung, Suwon-si (KR)

(73) Assignee: Samsung SDI Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 15/297,263

(22) Filed: Oct. 19, 2016

(65) Prior Publication Data

US 2017/0170344 A1 Jun. 15, 2017

(30) Foreign Application Priority Data

Dec. 15, 2015 (KR) .................. 10-2015-0179273
Sep. 28, 2016 (KR) .................. 10-2016-0125112

(51) Int. Cl.
*H01L 31/0224* (2006.01)
*C03C 8/04* (2006.01)
(Continued)

(52) U.S. Cl.
CPC ...... *H01L 31/022425* (2013.01); *C03C 3/122* (2013.01); *C03C 4/14* (2013.01);
(Continued)

(58) Field of Classification Search
CPC ... H02L 31/022425; C03C 3/122; C03C 4/14; C03C 8/04; C03C 8/18; C09D 1/00; C09D 5/24
See application file for complete search history.

(56) References Cited

U.S. PATENT DOCUMENTS

2003/0215747 A1* 11/2003 Kim .................. G03F 7/0047
430/284.1
2010/0186823 A1* 7/2010 Hsu .................... H01B 1/22
136/263
(Continued)

FOREIGN PATENT DOCUMENTS

| CN | 102341416 A | 2/2012 |
| CN | 102467989 A | 5/2012 |

(Continued)

OTHER PUBLICATIONS

KF-96 technical data (evidence).*
(Continued)

*Primary Examiner* — Matthew T Martin
(74) *Attorney, Agent, or Firm* — Lee & Morse, P.C.

(57) ABSTRACT

A composition for forming an electrode includes a conductive powder, a glass frit, an organic vehicle, and a burn-out retardant. The burn-out retardant exhibits a residual carbon of greater than or equal to about 1 wt % at a temperature of about 600° C. based on the initial amount of 100 wt % and an exothermic peak at about 200° C. to about 500° C.

6 Claims, 1 Drawing Sheet

(51) Int. Cl.
  *C09D 1/00*    (2006.01)
  *C03C 4/14*    (2006.01)
  *C09D 5/24*    (2006.01)
  *C03C 3/12*    (2006.01)
  *C03C 8/18*    (2006.01)

(52) U.S. Cl.
  CPC ............... *C03C 8/04* (2013.01); *C03C 8/18* (2013.01); *C09D 1/00* (2013.01); *C09D 5/24* (2013.01); *C03C 2205/00* (2013.01); *Y02E 10/50* (2013.01)

(56) References Cited

U.S. PATENT DOCUMENTS

| | | | | |
|---|---|---|---|---|
| 2013/0160836 A1* | 6/2013 | Kojo | ............... | H01L 31/022425 136/256 |
| 2014/0124713 A1* | 5/2014 | Majumdar | ............... | H01B 1/22 252/513 |

FOREIGN PATENT DOCUMENTS

| | | |
|---|---|---|
| CN | 102723121 A | 10/2012 |
| CN | 103694232 A | 4/2014 |
| CN | 104903973 A | 9/2015 |
| JP | 11-236569 | 8/1999 |
| JP | 2005-303282 | 10/2005 |
| JP | 4645594 | 3/2011 |
| KR | 10-0472375 | 2/2005 |
| KR | 10-2010-0005694 A | 1/2010 |
| KR | 10-2011-0117390 A | 10/2011 |
| KR | 10-2012-0065894 A | 6/2012 |
| KR | 10-2013-0025175 A | 3/2013 |
| KR | 10-2013-0107767 A | 10/2013 |
| KR | 10-2015-0014895 A | 2/2015 |
| KR | 10-2015-0031142 A | 3/2015 |
| TW | 201319213 A1 | 5/2013 |

OTHER PUBLICATIONS

Search Report dated Mar. 22, 2017 of the corresponding Taiwanese Patent Application No. 105133473.
Chinese Office Action and Search Report dated May 3, 2018.

* cited by examiner

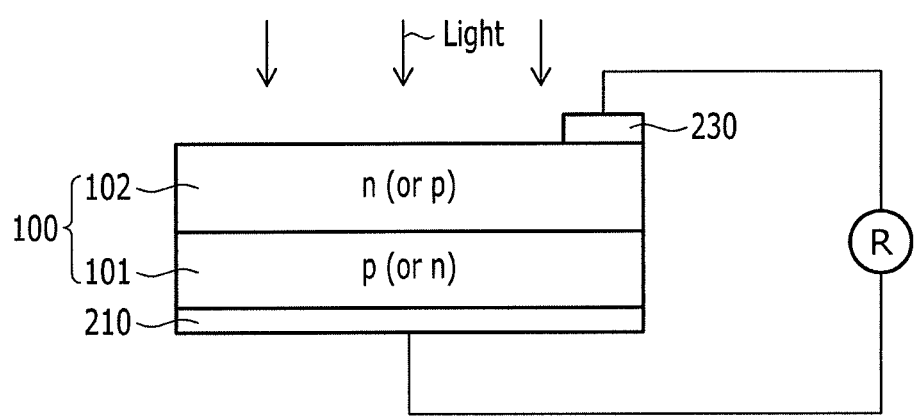

COMPOSITION FOR FORMING ELECTRODE, ELECTRODE MANUFACTURED USING THE SAME AND SOLAR CELL

CROSS-REFERENCE TO RELATED APPLICATION

Korean Patent Application Nos. 10-2015-0179273 and 10-2016-0125112, filed on Dec. 15, 2015 and Sep. 28, 2016, respectively in the Korean Intellectual Property Office, and entitled: "Composition for Forming Electrode, Electrode Manufactured Using the Same and Solar Cell," is incorporated by reference herein in its entirety.

BACKGROUND

1. Field

Embodiments relate to a composition for forming an electrode, an electrode manufactured using the same, and a solar cell.

2. Description of the Related Art

Solar cells may generate electrical energy using the photovoltaic effect of a p-n junction which may convert photons of sunlight into electricity. In the solar cell, front and rear electrodes may be formed on front and rear surfaces of a semiconductor substrate (a semiconductor wafer) with the p-n junction, respectively. The photovoltaic effect of the p-n junction may be induced by sunlight entering the substrate. Electrons generated by the photovoltaic effect of the p-n junction may provide an electric current to the outside through the electrodes.

The electrodes of the solar cell may be formed with predetermined patterns on the surface of the wafer by coating, patterning, and firing an electrode composition.

SUMMARY

Embodiments are directed to a composition for forming an electrode including a conductive powder, a glass frit, an organic vehicle and a burn-out retardant. The burn-out retardant exhibits a residual carbon of greater than or equal to about 1 wt % at a temperature of about 600° C. based on the initial amount of 100 wt %. The burn-out retardant exhibits an exothermic peak at about 200° C. to about 500° C.

The burn-out retardant may be included in the composition for forming an electrode in an amount of about 0.05 wt % to about 1.5 wt % based on the total amount of composition for forming an electrode.

The burn-out retardant may be an organic compound selected from an epoxy acrylate-based compound, a urethane acrylate-based compound, and a silicon-based compound.

The composition for forming an electrode may include about 60 wt % to about 95 wt % of the conductive powder, about 0.5 wt % to about 20 wt % of the glass frit, about 0.05 wt % to about 1.5 wt % of the burn-out retardant, and a balance amount of the organic vehicle.

The glass frit may include one or more elements selected from lead (Pb), tellurium (Te). bismuth (Bi). lithium (Li), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), silver (Ag), and aluminum (Al).

The organic vehicle may include an organic binder and a solvent.

The composition for forming an electrode may further include at least one selected from a surface-treatment agent, a dispersing agent, a thixotropic agent, a viscosity stabilizer, an antifoaming agent, pigment, an ultraviolet (UV) stabilizer, an antioxidant, and a coupling agent.

Embodiments are also directed to an electrode manufactured using the composition for forming an electrode.

Embodiments are also directed to a solar cell including the electrode.

BRIEF DESCRIPTION OF THE DRAWING

Features will become apparent to those of skill in the art by describing in detail exemplary embodiments with reference to the attached drawing in which:

FIG. 1 illustrates a schematic view of the structure of a solar cell according to an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figure, the dimensions of layers and regions may be exaggerated for clarity of illustration.

Hereinafter, each component of the composition for forming an electrode is described in detail.

The composition for forming an electrode may include a metal powder as a conductive powder. The metal powder may include at least one metal selected from silver (Ag), gold (Au), palladium (Pd), platinum (Pt), ruthenium (Ru), rhodium (Rh), osmium (Os), iridium (Ir), rhenium (Re), titanium (Ti), niobium (Nb), tantalum (Ta), aluminum (Al), copper (Cu), nickel (Ni), molybdenum (Mo), vanadium (V), zinc (Zn), magnesium (Mg), yttrium (Y), cobalt(Co), zirconium (Zr), iron (Fe), tungsten (W), tin (Sn), chromium (Cr), and manganese (Mn), as examples.

The particle size of the conductive powder may be within a nanometer or micrometer scale. For example, the conductive powder may have a particle size of dozens to several hundred nanometers, or several to dozens of micrometers. In example embodiments, the conductive powder may be a mixture of two or more types of silver powders having different particle sizes.

A particle shape of the conductive powder may be spherical, sheet-shape, or amorphous. The conductive powder may have an average particle diameter (D50) of about 0.1 µm to about 10 µm, or, for example about 0.5 µm to about 5 µm. The average particle diameter may be measured using, for example, a Model 1064D (CILAS Co., Ltd.) equipment after dispersing the conductive powder in isopropyl alcohol (IPA) at room temperature (about 20° C. to about 25° C.) for 3 minutes via ultrasonication. Within this range of average particle diameter, the composition may provide low contact resistance and low line resistance.

The conductive powder may be present in an amount of about 60 wt % to about 95 wt % based on 100 wt % of the composition for forming an electrode. Within this range, deterioration in conversion efficiency due to, for example, an increase in resistance may be reduced or prevented and hard formation of a paste caused by a relative decrease of an organic vehicle may also be reduced or prevented. In an embodiment, the conductive powder may be present in an amount of about 70 wt % to about 90 wt %.

The glass frit may serve to enhance adhesion between the conductive powder and the substrate and to promote the formation of silver crystal grains in an emitter region by etching an anti-reflection layer and melting the conductive powder so as to reduce contact resistance during a firing process of the composition for forming an electrode. During the firing process, a glass frit (described below) may be softened and may decrease the firing temperature.

When the area of the solar cell is increased in order to improve solar cell efficiency, contact resistance of the solar cell may be increased. Thus, it is desirable to minimize the influence on the p-n junction of the solar cell while minimizing series resistance (Rs). In addition, the firing temperature may vary within a broad range with increasing use of various wafers having different sheet resistances. Accordingly, it is desirable to provide a glass frit that can secure sufficient thermal stability to withstand a wide range of firing temperatures.

The glass frit may be one or more of a lead glass frit and a lead-free glass frit suitable for use in an electrode composition.

The glass frit may include at least one element selected from lead (Pb), tellurium (Te), bismuth (Bi), lithium (Li), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), silver (Ag), and aluminum (Al).

The glass frit may be prepared from oxides of the elements by a suitable method. For example, the oxides of the elements may be obtained by mixing the oxides of the metal elements in a predetermined ratio, melting the mixture, quenching the resultant, and then pulverizing the quenched product. Mixing may be performed using a ball mill or a planetary mill. The melting may be performed at about 700° C. to about 1300° C. and the quenching may be performed at room temperature (about 20° C. to about 25° C.). The pulverizing may be performed using a disk mill or a planetary mill as examples.

The glass frit may have an average particle diameter (D50) of about 0.1 μm to about 10 μm, and may be present in an amount of about 0.5 wt % to about 20 wt % based on 100 wt % of the composition for forming an electrode. Within this range, the glass fit may secure excellent adhesive strength of an electrode pattern while not deteriorating electrical characteristics of the electrode.

The glass frit may have a spherical shape or an amorphous shape. In an embodiment, two different kinds of glass frit having different transition temperatures may be used. For example, a first glass frit having a transition temperature ranging from about 200° C. to about 350° C. and a second glass fit having a transition temperature ranging from about 350° C. to about 550° C. may be mixed in a weight ratio ranging from about 1:0.2 to about 1:1.

The organic vehicle may impart suitable viscosity and rheological characteristics for printing to the composition for forming an electrode through mechanical mixing with the inorganic component of the composition for forming an electrode. The organic vehicle may include an organic binder and a solvent.

The organic binder may be selected from acrylate-based resins or cellulose-based resins. In an embodiment, the organic binder may be selected from ethyl cellulose, ethyl hydroxyethylcellulose, nitrocellulose, a mixture of ethylcellulose and phenolic resins, an alkyd resin, a phenol-based resin, an acrylate ester-based resin, a xylene-based resin, a polybutene-based resin, a polyester-based resin, a urea-based resin, a melamine-based resin, a vinyl acetate-based resin, wood rosin, or a polymethacrylate of an alcohol.

The organic binder may have a weight average molecular weight (Mw) of about 30,000 to about 200,000 g/mol, or, for example about 40,000 to about 150,000 g/mol. When the weight average molecular weight (Mw) is within the range, an excellent effect in term of printability may be obtained.

The solvent may be, for example, hexane, toluene, Texanol (2,2,4-trimethyl-1,3-pentanediol monoisobutyrate), methyl cellosolve, ethyl cellosolve, cyclohexanone, butyl cellosolve, aliphatic alcohol, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzyl alcohol, gamma-butyrolactone, ethyl lactate, or a combination thereof.

The organic vehicle may be present in an amount of about 1 wt % to about 30 wt %, for example about 5 wt % to about 20 wt % based on 100 wt % of the composition for forming an electrode. When the organic vehicle is used within the range, adhesion strength between an electrode pattern and a substrate may be improved, and excellent continuous printability may be secured.

The burn-out retardant may delay firing of an organic material in the composition for forming an electrode and may adjust the fluidity of the glass fit and thus may adjust the etching properties of an anti-reflection coating layer. Accordingly, damage that could occur where the electrode contacts an emitter may be minimized, and an open circuit voltage may be improved.

The burn-out retardant may be an organic compound having residual carbon in an amount greater than or equal to 1 wt % based on 100 wt % of the initial amount thereof at a temperature of about 600° C. For example, the burn-out retardant may have residual carbon in an amount range of in a range of about 1.0 wt % to about 60.0 wt % at a temperature of about 200° C. to about 500° C. and may exhibit an exothermic peak at about 210° C. to about 450° C. In general, residual carbon in an organic binder may have a negative influence on a composition for forming an electrode, and thus is commonly removed or minimized. However, residual carbon in a burn-out retardant may adjust the fluidity and etching properties of the glass fit and resultantly, may increase an open circuit voltage. When the burn-out retardant has residual carbon of about 1 wt % or greater, of residual carbon, the amount of the residual carbon may be sufficient to adjust the fluidity of the glass frit. An amount of the residual carbon may be measured at about 600° C. after increasing a temperature at about 10° C./min to about 30° C./min up to a temperature of about 600° C. through TG-DTA (Thermogravimetry-Differential Thermal Analysis).

In addition, when the burn-out retardant has an exothermic temperature of about 200° C. or greater, the burn-out retardant has an exothermic temperature greater than or equal to a temperature where fluidity of glass starts. Thus, the burn-out retardant may exhibit a burn-out retardancy function and may increase an open circuit voltage. When the burn-out retardant has an exothermic temperature of less than about 500° C., a delay in the burn-out function and a resulting increase in resistance of an electrode, resulting in deteriorating efficiency of a solar cell, may be avoided. The exothermic temperature may be measured through TG-DTA (Thermogravimetry-Differential Thermal Analysis) under a condition of increasing a temperature at about 5° C./min to about 20° C./min. The exothermic temperature means the temperature at the top of a peak accompanying weight loss in the TG-DTA graph.

The burn-out retardant may be used in an amount of about 0.05 wt % to about 1.5 wt %, or, for example, about 0.1 to about 1.2 wt % based on the total amount of composition for forming an electrode. Within the ranges, an open circuit voltage may be increased, and efficiency of a solar cell may be improved.

The burn-out retardant may be an organic compound selected from an epoxy acrylate-based compound, a urethane acrylate-based compound, or a silicon-based compound.

The composition for forming an electrode may further include typical additives, as desired, to enhance flow properties, process properties, and stability. The additives may include a surface-treatment agent, a dispersing agent, a thixotropic agent, a plasticizer, a viscosity stabilizer, an antifoaming agent, a pigment, an ultraviolet (UV) stabilizer, an antioxidant, a coupling agent, or the like. These additives may be used alone or as mixtures thereof.

The additives may be present in an amount of about 0.1 to about 5 wt % based on 100 wt % of the composition for forming an electrode. This amount may be changed as desired. The amount of the additive may be selected, considering printing characteristics, dispersion, and storage stability of the composition for forming an electrode.

Embodiments further provide an electrode formed from the composition for forming an electrode and a solar cell including the electrode.

Referring to FIG. 1, a solar cell according to an embodiment is illustrated. FIG. 1 illustrates a schematic view of the structure of the solar cell according to an embodiment.

Referring to FIG. 1, a rear electrode 210 and a front electrode 230 may be formed by printing an electrode composition on a substrate 100 including a p layer (or an n layer) 101 and an n layer (or a p layer) 102 as an emitter and then firing the resultant structure. For example, the electrode composition may be print-coated on the rear side of the substrate 100 and then heat-treated at about 200° C. to about 400° C. for about 10 to about 60 seconds to perform a prior preparation step for the rear electrode.

A prior preparation step for the front electrode may be performed by printing the electrode composition on the front surface of the substrate 100 and then drying the electrode composition. Then, the electrode composition may be fired at about 400° C. to about 980° C., for example, at about 700° C. to about 980° C., for about 30 seconds to about 210 seconds to form the front and rear electrodes.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Preparation of Composition for Forming Electrode

Examples 1 to 9 and Comparative Examples 1 and 2

A composition for forming an electrode was prepared by sufficiently dissolving an organic binder (Mw=50,000 g/mol, STD4, Dow Chemical Company) in a solvent (Texanol (Eastman)) according to a composition provided in Table 1 at 60° C., adding spherical silver (Ag) powder (AG-5-11F, Dowa Hightech Co., Ltd.) having an average particle diameter of 1.5 μm, a Bi—Te—Ag—Li—Zn—O-based glass frit (Bi/Te/Ag/Li/Zn (mol %)=10/61/9/8/12), a respective burn-out retardant according to Table 2, a dispersing agent (BYK-102, BYK-chemie), and a thixotropic agent (Thixatrol ST, Elementis Co.) thereto, and mixing and dispersing the mixture with a three roll mill.

TABLE 1

(unit: wt %)

| | Silver powder | Glass frit | Organic binder | Solvent | Burn-out retardant and amounts | Dispersing agent | Thixotropic agent |
|---|---|---|---|---|---|---|---|
| Ex. 1 | 89.0 | 3.0 | 1.0 | 6.2 | (A) 0.3 | 0.3 | 0.2 |
| Ex. 2 | 89.0 | 3.0 | 1.0 | 5.5 | (A) 1.0 | 0.3 | 0.2 |
| Ex. 3 | 89.0 | 3.0 | 1.0 | 6.2 | (B) 0.3 | 0.3 | 0.2 |
| Ex. 4 | 89.0 | 3.0 | 1.0 | 6.2 | (C) 0.3 | 0.3 | 0.2 |
| Ex. 5 | 89.0 | 3.0 | 1.0 | 6.2 | (D) 0.3 | 0.3 | 0.2 |
| Ex. 6 | 89.0 | 3.0 | 1.0 | 6.2 | (E) 0.3 | 0.3 | 0.2 |
| Ex. 7 | 89.0 | 3.0 | 1.0 | 6.2 | (F) 0.3 | 0.3 | 0.2 |
| Ex. 8 | 89.0 | 3.0 | 1.0 | 6.2 | (G) 0.3 | 0.3 | 0.2 |
| Ex. 9 | 89.0 | 3.0 | 1.0 | 6.2 | (H) 0.3 | 0.3 | 0.2 |
| Comp. Ex. 1 | 89.0 | 3.0 | 1.0 | 6.2 | (I) 0.3 | 0.3 | 0.2 |
| Comp. Ex. 2 | 89.0 | 3.0 | 1.0 | 6.5 | — | 0.3 | 0.2 |

TABLE 2

| | Tradename (Manufacturer) | Burn-out retardant | Exothermic peak temperature (° C.) | Amount of residual carbon (wt %) (at 600° C.) |
|---|---|---|---|---|
| (A) | EBECRYL 350 (ENTIS) | silicon-based compound | 359 | 10.0 |
| (B) | EBECRYL 1360 (UCB) | silicon-based compound | 410 | 2.0 |
| (C) | KF-96 (Shin-Etsu Chemical Co., Ltd.) | silicon-based compound | 388 | 35.4 |
| (D) | EBECRYL 9716 (ENTIS) | epoxy acrylate-based compound | 232 | 14.2 |
| (E) | EBECRYL 600 (ENTIS) | epoxy acrylate-based compound | 337 | 10.3 |

TABLE 2-continued

| | Tradename (Manufacturer) | Burn-out retardant | Exothermic peak temperature (° C.) | Amount of residual carbon (wt %) (at 600° C.) |
|---|---|---|---|---|
| (F) | EBECRYL 1290 (ENTIS) | urethane acrylate-based compound | 239 | 4.9 |
| (G) | EBECRYL 8210 (ENTIS) | urethane acrylate-based compound | 284 | 1.4 |
| (H) | UP111 (ENTIS) | urethane acrylate-based compound | 238 | 3.1 |
| (I) | UA7933 (ENTIS) | urethane acrylate-based compound | 414 | 0.03 |

Measurement of Amount of Residual Carbon of Burn-Out Retardant

Amounts of the residual carbon were obtained by increasing a temperature for 30 mg of each burn-out retardant used in Examples 1 to 9 and Comparative Example 1 were measured at about 20° C./min up to a temperature of 600° C. and then measuring the same at 600° C. The results are provided in Table 2, above.

Measurement of Exothermic Peak Temperature of Burn-Out Retardant

An exothermic peak temperature was measured by heating each mixture including a burn-out retardant, an organic binder, and a solvent according to Examples 1 to 9 and Comparative Example 1 at 10° C./min through TG-DTA (Thermogravimetry-Differential Thermal Analysis). The organic vehicle (an organic binder and a solvent) does not affect the exothermic peak temperature of the burn-out retardant. The results are provided in Table 2, above.

Solar Cell Efficiency Evaluation

The compositions for forming an electrode according to Examples and

Comparative Examples were respectively screen-printed to form a predetermined pattern on a multi crystalline wafer obtained by texturing the front side of a wafer (a p type wafer doped with boron) and forming an n⁺ layer with $POCl_3$ and then, an anti-reflection coating layer with silicon nitride (SiNx:H) thereon and drying at 300 to 400° C. in an infrared ray drying furnace. Subsequently, an aluminum paste was printed on the rear side of the wafer and then, dried using the same method as above. A cell manufactured through the above process was fired in a belt-type furnace at 400 to 900° C. for 30 to 180 seconds to obtain a test cell.

Open-circuit voltage ($V_{oc}$, mV), series resistance ($R_s$, Ω), conversion efficiency (Eff., %) of the test cell were measured by using a solar cell efficiency-measuring equipment (CT-801, Passan). The results are provided in Table 3.

TABLE 3

| | $V_{oc}$ (mV) | $R_s$ (mΩ) | Efficiency (%) |
|---|---|---|---|
| Example 1 | 628.3 | 2.65 | 17.86 |
| Example 2 | 629.1 | 2.99 | 17.83 |
| Example 3 | 628.2 | 2.75 | 17.84 |
| Example 4 | 629.0 | 2.87 | 17.85 |
| Example 5 | 628.6 | 2.66 | 17.86 |
| Example 6 | 628.1 | 2.66 | 17.83 |
| Example 7 | 629.0 | 2.78 | 17.85 |
| Example 8 | 628.0 | 2.61 | 17.80 |
| Example 9 | 627.9 | 2.59 | 17.81 |
| Comparative Example 1 | 626.9 | 2.59 | 17.68 |
| Comparative Example 2 | 626.1 | 2.60 | 17.67 |

Referring to Table 3, each solar cell manufactured by using a respective composition for forming an electrode including a burn-out retardant according to Examples 1 to 9 showed a minimal increase in resistance but an increased open-circuit voltage and thus increased efficiency compared with a solar cell according to Comparative Example 2. A cell manufactured by using the composition for forming an electrode including a burn-out retardant having residual carbon beyond the range of the present invention according to Comparative Example 1 exhibited little open circuit voltage-increasing effect.

By way of summation and review, a front electrode of the solar cell may exhibit an improved open circuit voltage when damage at a location where the front electrode contacts with the wafer is minimized while maximizing incident light. Thereby, maximum efficiency of the solar cell may be realized. Therefore, development of a composition for forming an electrode that is capable of minimizing damage where the electrode contacts the wafer is desirable.

Embodiments provide a composition for forming an electrode capable of improving cell efficiency by minimizing damage where the electrode contacts a wafer and thus improving an open circuit voltage. Embodiments provide an electrode manufactured using the composition for forming an electrode and a solar cell including the electrode.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof.

What is claimed is:

1. A composition for forming a solar cell electrode, the composition comprising:
    a conductive powder;
    a glass frit;
    an organic vehicle, the organic vehicle including a binder and a solvent; and
    a burn-out retardant,
    wherein the burn-out retardant is selected as exhibiting a residual carbon of greater than or equal to about 1 wt % as measured by increasing a temperature of the burn-out retardant by about 20° per minute up to at a temperature of about 600° C. based on the initial amount of 100 wt %, and
    the burn-out retardant is selected as exhibiting an exothermic peak at about 200° C. to about 500° C. as measured by Thermogravimetry-Differential Thermal Analysis (TG-DTA),
    wherein the burn-out retardant is included in the composition for forming an electrode in an amount of about 0.05 wt % to about 1.5 wt % based on the total amount of composition for forming an electrode, and
    wherein the burn-out retardant is a silicone acrylate.

2. The composition for an electrode as claimed in claim 1, wherein the composition for forming an electrode includes about 60 wt % to about 95 wt % of the conductive powder, about 0.5 wt % to about 20 wt % of the glass frit, the about 0.05 wt % to about 1.5 wt % of the burn-out retardant, and a balance amount of the organic vehicle.

3. The composition for forming an electrode as claimed in claim 1, wherein the glass frit includes one or more elements selected from lead (Pb), tellurium (Te), bismuth (Bi), lithium (Li), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), silver (Ag), and aluminum (Al).

4. The composition for forming an electrode as claimed in claim 1, wherein the composition for forming an electrode further comprises at least one selected from a surface-treatment agent, a dispersing agent, a thixotropic agent, a viscosity stabilizer, an antifoaming agent, a pigment, an ultraviolet (UV) stabilizer, an antioxidant, and a coupling agent.

5. An electrode manufactured using the composition for forming an electrode as claimed in claim 1.

6. A solar cell comprising the electrode as claimed in claim 5.

* * * * *